(12) United States Patent
Lin et al.

(10) Patent No.: US 8,729,432 B2
(45) Date of Patent: May 20, 2014

(54) CAPACITANCE SENSING SWITCH MODULE

(75) Inventors: I-Shen Lin, Taoyuan Hsien (TW); Ming-Jen Liang, Taoyuan Hsien (TW); Yu-Tang Liu, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 274 days.

(21) Appl. No.: 13/216,254

(22) Filed: Aug. 24, 2011

(65) Prior Publication Data

US 2012/0234822 A1 Sep. 20, 2012

(30) Foreign Application Priority Data

Mar. 15, 2011 (CN) .......................... 2011 1 0072136

(51) Int. Cl.
*H05B 3/68* (2006.01)
*H03K 17/975* (2006.01)

(52) U.S. Cl.
USPC ................ 219/446.1; 219/443.1; 219/448.17; 200/600

(58) Field of Classification Search
USPC ................. 219/446.1, 443.1, 448.13, 448.17, 219/452.11; 200/600
See application file for complete search history.

(56) References Cited

FOREIGN PATENT DOCUMENTS

| CN | 1845049 A | 10/2006 |
|---|---|---|
| CN | 1865779 A | 11/2006 |
| CN | 1958423 A | 5/2007 |
| CN | 200941352 Y | 8/2007 |
| CN | 101355355 A | 1/2009 |
| JP | 62-103932 | 5/1987 |
| JP | 63-33519 | 3/1988 |
| JP | 63-99727 | 5/1988 |
| JP | 2005-55043 | 3/2005 |
| JP | 2005-308341 | 4/2005 |
| JP | 2006-194481 | 7/2006 |
| JP | 2006-322674 | 11/2006 |
| JP | 2006-336101 A | 12/2006 |
| JP | 2009-295365 | 12/2009 |
| JP | 2010-277914 | * 12/2010 |

* cited by examiner

*Primary Examiner* — Shawntina Fuqua
(74) *Attorney, Agent, or Firm* — CKC & Partners Co., Ltd.

(57) ABSTRACT

A capacitance sensing switch module is provided. The capacitance sensing switch module for controlling a cooktop includes a plate, at least one key, an insulating pad, a circuit board and at least one foil. The plate is disposed in a side of the cooktop and has at least one hole passing through the plate. The key is disposed in the hole. The insulating pad is disposed between the key and the plate. The key and the plate are separated by the insulating pad. The circuit board is disposed under the plate. The foil is disposed on the circuit board and on the position corresponding to the key. There is an insulation gap between the foil and the key.

8 Claims, 4 Drawing Sheets

CAPACITANCE SENSING SWITCH MODULE

RELATED APPLICATIONS

This application claims priority to Chinese Application Serial Number 201110072136.X, filed Mar. 15, 2011, which is herein incorporated by reference.

BACKGROUND

1. Field of Invention

The present invention relates to a capacitance sensing switch, and more particularly to a capacitance sensing switch used on a glass-ceramic cooktop.

2. Description of Related Art

A glass-ceramic cooktop not only has a beautiful appearance but also is easily to clean the cooking surface. Therefore, the glass-ceramic cooktop has become a standard kitchen appliance for the purpose of cooking food.

FIG. 1 illustrates a schematic diagram of a traditional glass-ceramic cooktop. The traditional glass-ceramic cooktop 100 includes a glass plate 101, five burners 102 on the top and installed into the glass plate 101, and a control region 103 formed in the glass plate 101. A plurality of capacitance sensing switch keys is formed in the control region 103 to control the five burners 102 respectively. A capacitance sensing switch key includes a capacitor. When a conductor, such as a finger, touches the capacitance sensing switch key, some charge stored in the capacitor of the capacitance sensing switch key is moved to the conductor, which results in the change of the capacitance of the capacitor. A micro-controller detects the capacitance change to trigger a corresponding operation.

However, the performance of a capacitance sensing switch key is easily affected by environmental factors. For example, when burning soup in a burner, the spilled soup can touch a capacitance sensing switch key to trigger an unwanted operation to cause a dangerous situation. On the other hand, because the glass plate 101 is an insulation material, these capacitance sensing switch keys 102 built in the glass plate 101 are insulated to each other. Therefore, when a user touches one of the capacitance sensing switch keys, only the charges stored in the touched capacitance sensing switch key are redistributed. The charges stored in other capacitance sensing switch keys are kept. Therefore, only the corresponding operation controlled by the touched capacitance sensing switch key is triggered. However, if the capacitance sensing switch keys are built in a conductor plate, the capacitance sensing switch keys are conducted to each other. Therefore, when a user touches one of the capacitance sensing switch keys, the charges stored in all capacitance sensing switch keys are redistributed. The micro-controller can not determine which one of the capacitance sensing switch keys is touched, which will cause a mistake operation. That is, a glass plate has to be adopted to form a cooktop when a user wants to use the capacitance sensing switch keys to control the burners, which is not convenient for a kitchen designer.

SUMMARY

An object of the present invention is to provide a capacitance sensing switch module. The capacitance sensing switch module can be embedded in any plate to control the burners even though this plate is a conductor plate.

An object of the present invention is to provide a key structure of a capacitance sensing switch module to remove the affection from environmental factors.

The present invention provides a capacitance sensing switch module used to control burners of a cooktop. The capacitance sensing switch module includes a plate, at least one key, an insulating pad, a circuit board and at least one foil. The plate is disposed in a side of the cooktop. The plate has at least one hole passing through the plate. The key is disposed in the hole. The insulating pad is disposed between the key and the plate, the key and the plate are separated by the insulating pad. The circuit board is disposed under the plate. The foil is disposed on the circuit board and on the position corresponding to the key. There is an insulation gap between the foil and the key.

In an embodiment, the plate is a conductor plate.

In an embodiment, the insulation pad is a plastic pad or an elastic pad made by a rubber.

The present invention also provides a cooktop. The cooktop includes a glass plate, at least one burner embedded in the glass plate, and a capacitance sensing switch module disposed in a side of the glass plate. The capacitance sensing switch module further includes a plate, at least one key, an insulating pad, a circuit board and at least one foil. The plate has at least one hole passing through the plate. The key is disposed in the hole. The insulating pad is disposed between the key and the plate, the key and the plate are separated by the insulating pad. The circuit board is disposed under the plate. The foil is disposed on the circuit board and on the position corresponding to the key. There is an insulation gap between the foil and the key.

Accordingly, the capacitance sensing switch module of the present invention is an independent module and separated from the cooktop. Therefore, the appearance of the capacitance sensing switch module can be varied based on the usage environment and the user habit. That is, the capacitance sensing switch module can be customized. Moreover, the capacitance sensing switch module can maintain in a lower temperature even though the glass plate of the cooktop has a higher temperature because the capacitance sensing switch module is separated from the glass plate.

BRIEF DESCRIPTION OF THE DRAWINGS

In order to make the foregoing as well as other aspects, features, advantages, and embodiments of the present invention more apparent, the accompanying drawings are described as follows.

DETAILED DESCRIPTION

Figure 1:
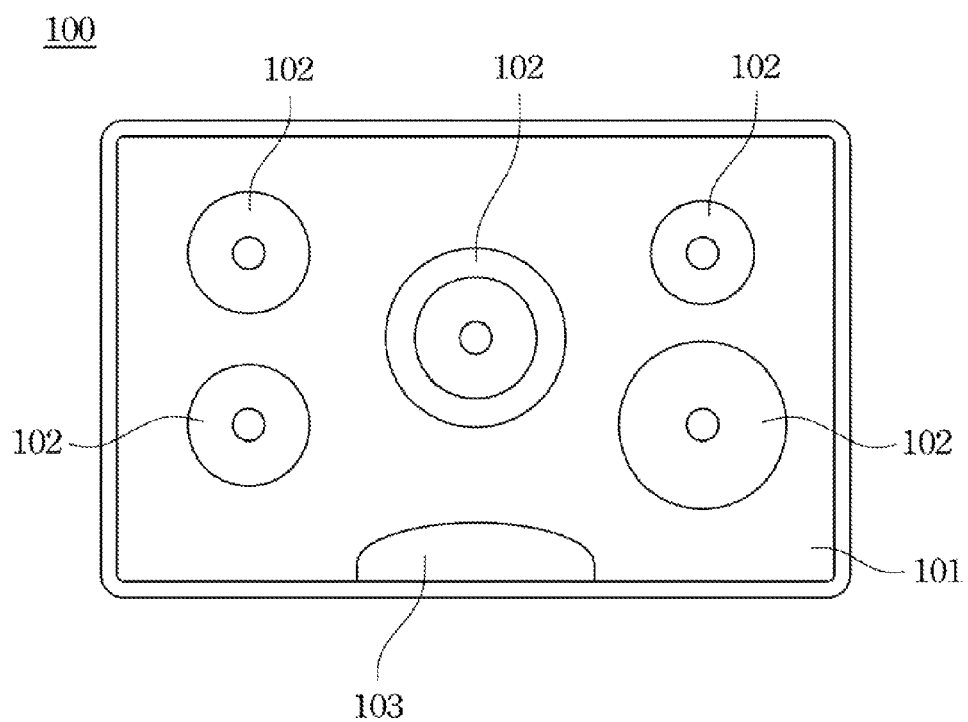
FIG. 1 illustrates a schematic diagram of a traditional glass-ceramic cooktop.

Reference will now be made in detail to the present embodiments of the invention, examples of which are illustrated in the accompanying drawings. Wherever possible, the same reference numbers are used in the drawings and the description to refer to the same or like parts.

Figure 2A:
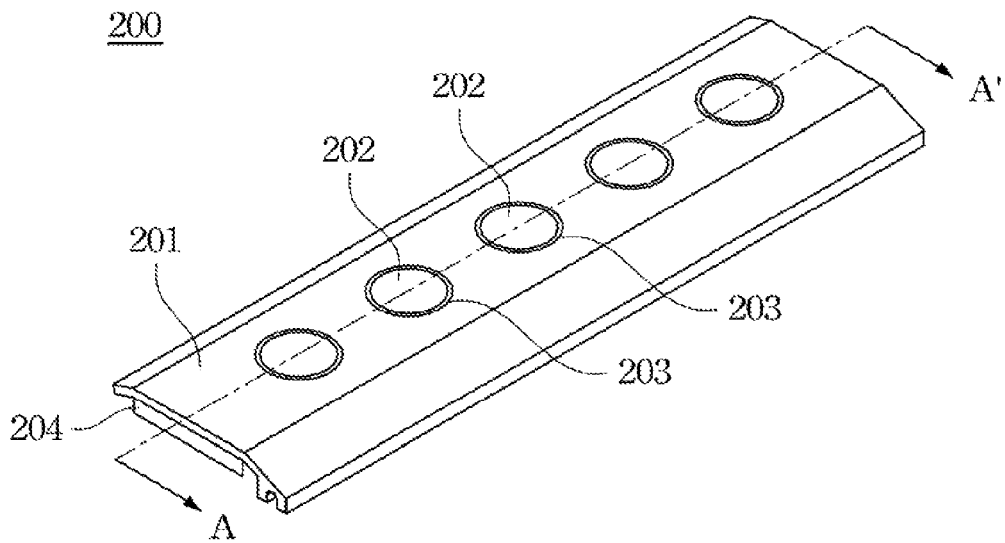
FIG. 2A is a top view of a capacitance sensing switch module according to an embodiment of the present invention.
Figure 2B:
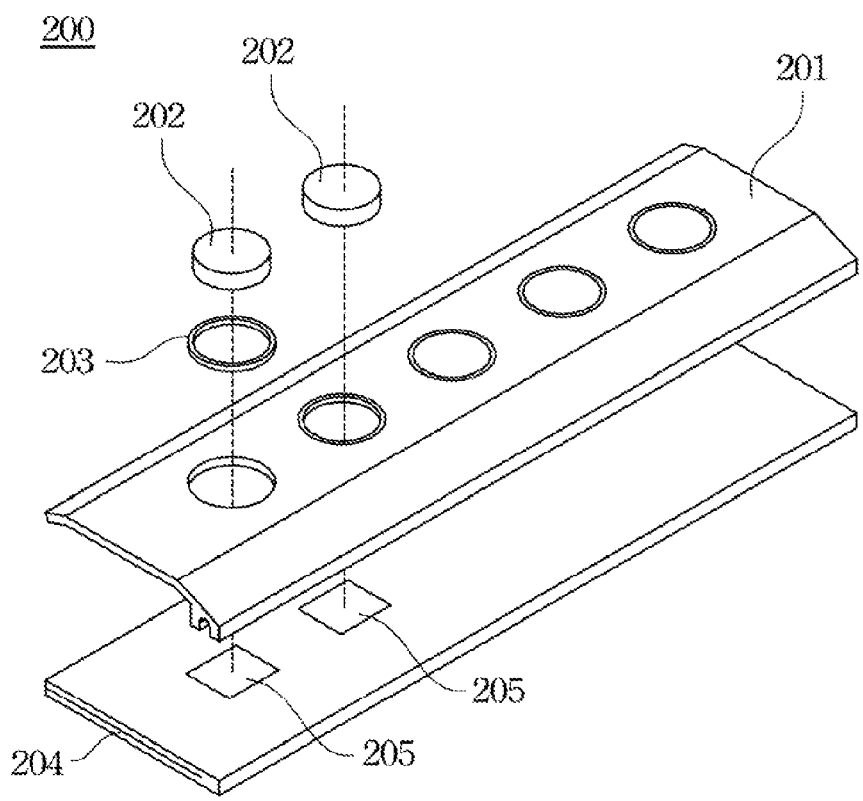
FIG. 2B is an explosion diagram of a capacitance sensing switch module according to an embodiment of the present invention.
Figure 2C:
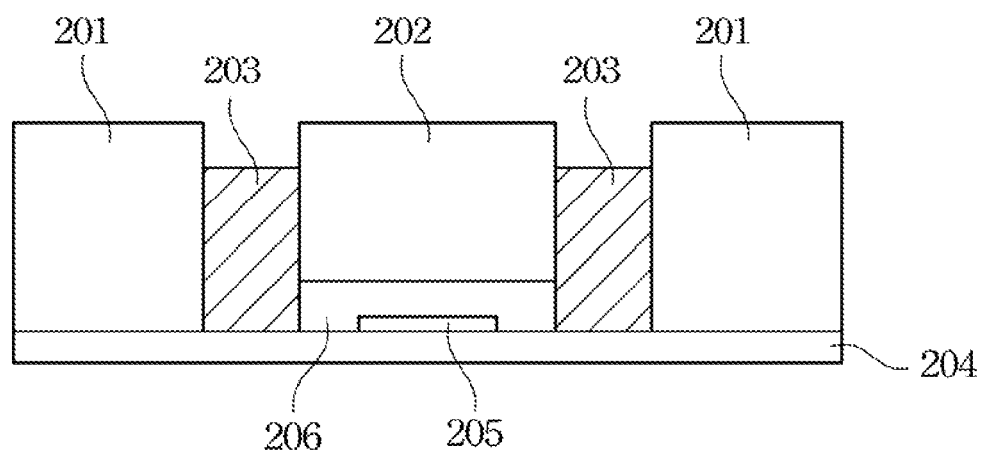
FIG. 2C is a cross section view from an AA' line in the FIG. 2A.

FIG. 2A is a top view of a capacitance sensing switch module according to an embodiment of the present invention. FIG. 2B is an explosion diagram of a capacitance sensing switch module according to an embodiment of the present invention. FIG. 2C is a cross section view from an AA' line in the FIG. 2A. It is noticed that only one capacitance sensing switch key is illustrated in FIG. 2C. However, in another embodiment, the capacitance sensing switch module can have a lot of capacitance sensing switch keys. Please refer to FIGS. 2A, 2B and 2C.

The capacitance sensing switch module 200 includes a plate 201, a plurality of key 202, a plurality of insulating pad 203, a circuit board 204 and a plurality of foil 205. In this embodiment, the material of the plate 201 is a metal. However, in another embodiment, the material of the plate 201 can be a non-metal. Holes passing through the plate 201 are formed. The keys 202 and the insulating pads 203 are disposed in the holes respectively. The insulating pads 203 are disposed between the keys 202 and the plate 201, the key 202 and the plate 201 are separated by the insulating pad 203. The circuit board 204 is disposed under the plate 201. The foils 205 are disposed on the circuit board 204 and on the positions corresponding to the keys 202. There is an insulation gap 206 between the foil 205 and corresponding key 202. The keys 202 are connected to a control circuit formed in the circuit board 204 through the foils 205. In other words, a user can touch the capacitance sensing switch keys 202 to control the control circuit. For example, when a user uses his finger to touch one of the capacitance sensing switch keys 202, charges on the key 202 is redistributed through the user body to result in the capacitance of the capacitance sensing switch being varied. A micro-controller (not shown in these Figs.) detects the capacitance change and generates a control signal to transfer to corresponding control circuit through the foil 205 to trigger a corresponding operation.

Moreover, the insulating pads 203 disposed between the keys 202 and the plate 201 can insulate the keys 202 from the plate 201. Therefore, when a user touches one of the capacitance sensing switch keys 202, only the charges stored in the touched capacitance sensing switch key 202 are redistributed. The charges stored in other capacitance sensing switch keys 202 are kept. Therefore, only the corresponding operation controlled by the touched capacitance sensing switch key 202 is triggered. However, in another embodiment, it is not necessary to form a totally insulation situation between the keys 202 and the plate 201 as long as the impedance created by the insulating pads 203 can make the micro-controller distinct the touched key. The insulating pads 203 is a plastic pad or an elastic pad made by a rubber. The insulating pads 203 is totally or partially filled between the keys 202 and the plate 201. In another embodiment, the insulating pads 203 is made by an elastic material. In this case, when a user presses the keys 202, the keys 202 move a distance in the insulation gap 206. Such movement reduces the distance between the keys 202 and the foils 205 to increase the change value of capacitance. Therefore, a micro-controller can detect a larger capacitance change value. That is, a larger change value of capacitance can be set as a threshold value to trigger the capacitance sensing switch. Such larger threshold value can prevent the control circuit be unwanted triggered by environmental factors.

Figure 3:
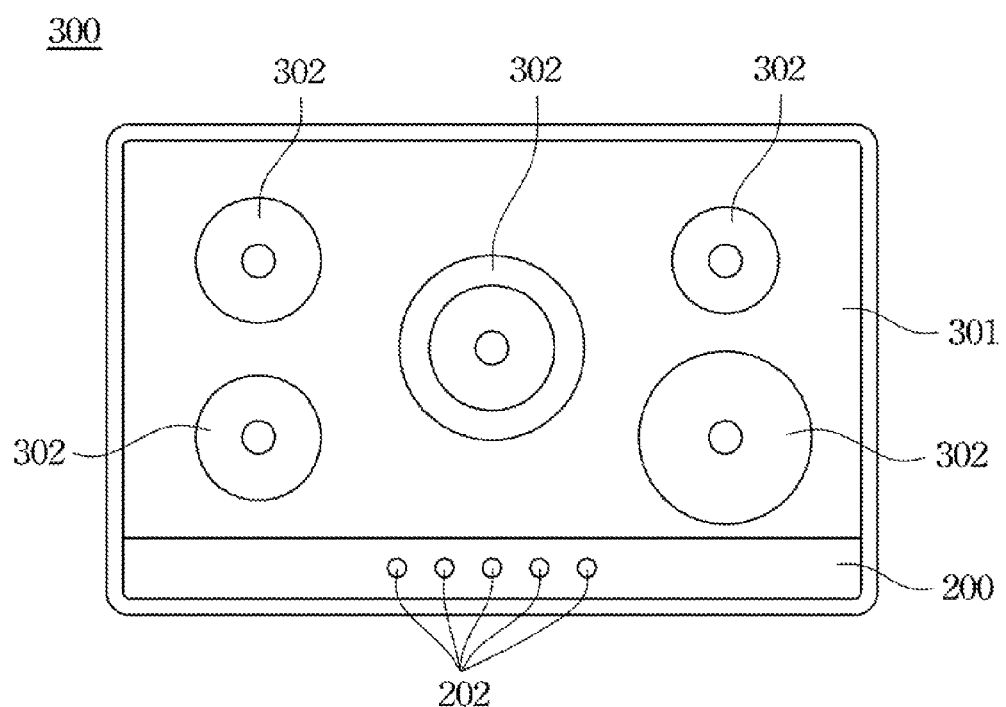
FIG. 3 is a schematic diagram of a cooktop according to an embodiment of the present invention.

FIG. 3 is a schematic diagram of a cooktop according to an embodiment of the present invention. The cooktop 300 includes a glass plate 301, a plurality of burners 302 embedded in the glass plate 301, and a capacitance sensing switch module 200 disposed in a side of the glass plate 301. The capacitance sensing switch module 200 includes keys 202 to control the burners 302 respectively. A user can touch the keys 202 to switch the operation of the burners. For example, a user uses his finger to touch the key 202, charges on this key 202 is redistributed through the user body to change the capacitance. A micro-controller detects the capacitance change and generates a signal to control the corresponding burner 302.

Accordingly, the capacitance sensing switch module 200 of the present invention is an independent module and separated from the glass plate 301. Therefore, the appearance of the capacitance sensing switch module 200 can be varied based on the usage environment. Moreover, because the capacitance sensing switch module 200 is separated from the glass plate 301, even though the glass plate 301 has a higher temperature, the capacitance sensing switch module 200 can still maintain in a lower temperature. On the other hand, the material of the plate 301 of the capacitance sensing switch module 200 is not limited to a glass. Therefore, different color can be coated in the capacitance sensing switch module 200 to get a better visual feeling. Furthermore, keys 202 are embedded in the plate 301. Therefore, the capacitance sensing switch module 200 has a flat surface. The flat surface is easily to clean. Moreover, in this preferred embodiment, the capacitance sensing switch module 200 is located in the front side of the glass plate 301. However, in other embodiments, the capacitance sensing switch module 200 can be located in the right side or left side of the glass plate 301 or other designed position.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A capacitance sensing switch module for controlling a cooktop, comprising:
    a plate disposed in a side of the cooktop, wherein the plate has at least one hole passing through the plate;
    a key disposed in the hole;
    an insulating pad disposed between the key and the plate, the key and the plate are separated by the insulating pad;
    a circuit board disposed under the plate; and
    a foil disposed on the circuit board and on the position corresponding to the key, wherein an insulation gap is formed between the foil and the key.

2. The capacitance sensing switch module of claim 1, wherein the plate is a conductor plate.

3. The capacitance sensing switch module of claim 1, wherein when the key is pressed, the key moves a distance in the insulation gap.

4. The capacitance sensing switch module of claim 1, wherein the insulation pad is a plastic pad or an elastic pad made by a rubber.

5. A cooktop, comprising:
    a glass plate;
    at least one burners embedded in the glass plate; and
    a capacitance sensing switch module disposed in a side of the glass plate, wherein the capacitance sensing switch module further comprises:
        a plate has at least one hole passing through the plate;
        a key disposed in the hole;
        an insulating pad disposed between the key and the plate, the key and the plate are separated by the insulating pad;
        a circuit board disposed under the plate; and
        a foil disposed on the circuit board and on the position corresponding to the key, wherein an insulation gap is formed between the foil and the key.

6. The cooktop of claim 5, wherein the plate is a conductor plate.

7. The cooktop of claim 5, wherein when the key is pressed, the key moves a distance in the insulation gap.

8. The cooktop of claim 5, wherein the insulation pad is a plastic pad or an elastic pad made by a rubber.

* * * * *